(12) United States Patent
Ajioka et al.

(10) Patent No.: US 7,236,070 B2
(45) Date of Patent: Jun. 26, 2007

(54) ELECTRONIC COMPONENT MODULE AND MANUFACTURING METHOD THEREOF

(75) Inventors: Eriko Ajioka, Tokyo (JP); Hitoyoshi Kurata, Tokyo (JP); Hideaki Shimoda, Tokyo (JP); Shigeru Asami, Tokyo (JP)

(73) Assignee: TDK Corporation, Tokyo (JP)

( * ) Notice: Subject to any disclaimer, the term of this patent is extended or adjusted under 35 U.S.C. 154(b) by 16 days.

(21) Appl. No.: 10/928,244

(22) Filed: Aug. 30, 2004

(65) Prior Publication Data

US 2005/0088260 A1 Apr. 28, 2005

(30) Foreign Application Priority Data

Sep. 10, 2003 (JP) .............................. 2003-317757

(51) Int. Cl.
*H01P 1/00* (2006.01)
(52) U.S. Cl. .................. 333/247; 333/24 C; 333/24 R; 343/700 MS
(58) Field of Classification Search ................ 333/247, 333/24 C, 24 R
See application file for complete search history.

(56) References Cited

U.S. PATENT DOCUMENTS

| | | | | |
|---|---|---|---|---|
| 5,323,128 A | * | 6/1994 | Ishizaki et al. ............. 333/204 |
| 5,768,109 A | * | 6/1998 | Gulick et al. ................ 361/794 |
| 6,104,264 A | * | 8/2000 | Ishikawa et al. ............ 333/239 |
| 6,188,297 B1 | * | 2/2001 | Akiba .......................... 333/12 |
| 6,455,453 B1 | * | 9/2002 | Chikagawa ................. 501/120 |
| 6,456,172 B1 | * | 9/2002 | Ishizaki et al. ............. 333/133 |
| 6,476,463 B1 | * | 11/2002 | Kaneko et al. ............. 257/660 |
| 6,515,562 B1 | * | 2/2003 | Takenoshita et al. ....... 333/248 |
| 6,570,469 B2 | * | 5/2003 | Yamada et al. ............. 333/193 |
| 6,784,759 B2 | * | 8/2004 | Maekawa et al. ........... 333/132 |
| 6,784,765 B2 | * | 8/2004 | Yamada et al. ............. 333/193 |
| 6,794,961 B2 | * | 9/2004 | Nagaishi et al. ............ 333/247 |
| 6,914,787 B2 | * | 7/2005 | Ajioka et al. ............... 361/816 |
| 6,917,526 B2 | * | 7/2005 | Ajioka et al. ............... 361/816 |
| 7,064,630 B2 | * | 6/2006 | Hirabayashi et al. ....... 333/204 |
| 7,102,896 B2 | * | 9/2006 | Ajioka et al. ............... 361/816 |

FOREIGN PATENT DOCUMENTS

EP 0 198 698 B1 10/1986

(Continued)

*Primary Examiner*—Robert Pascal
*Assistant Examiner*—Kimberly E Glenn
(74) *Attorney, Agent, or Firm*—Oblon, Spivak, McClelland, Maier & Neustadt, P.C.

(57) ABSTRACT

An electronic component module has a device-side module A and an antenna-side module B. The device-side module A is equipped with a first dielectric substrate 11 that is formed with a first transmission line 11a and a high-frequency device 13 that is mounted on the first dielectric substrate 11 and is connected to the first transmission line 11a. The antenna-side module B is equipped with a second dielectric substrate 12 that is laid on the first dielectric substrate 11 in such a manner that they are arranged in a lamination direction and that is formed with a second transmission line 12a that is electrically connected to the first transmission line 11, and an antenna element 14 that is provided on the second dielectric substrate 12 and electrically connected to the high-frequency device 13 via the second transmission line 12a and the first transmission line 11a.

10 Claims, 5 Drawing Sheets

FOREIGN PATENT DOCUMENTS

| | | |
|---|---|---|
| EP | 0 963 001 A2 | 12/1999 |
| EP | 1 307 078 A2 | 5/2003 |
| FR | 2 710 195 | 3/1995 |
| JP | 63-316905 | 12/1988 |
| JP | 7-170115 | 7/1995 |
| JP | 9-64636 | 3/1997 |
| JP | 9-237867 | 9/1997 |
| JP | 10-303640 | 11/1998 |
| JP | 2000-216630 | 8/2000 |
| JP | 2001-28413 | 1/2001 |
| JP | 2002-164733 | 6/2002 |
| JP | 2003-204211 | 7/2003 |
| WO | WO 99/62135 | 12/1999 |

* cited by examiner

ELECTRONIC COMPONENT MODULE AND MANUFACTURING METHOD THEREOF

BACKGROUND OF THE INVENTION

The present invention relates to an electronic component module and its manufacturing method and, more particularly, to a technique that is effective in increasing the bandwidth of an electronic component module.

With a recent tendency of miniaturization and functionality enhancement of electronic apparatus, there is demand for electronic component modules in which a module incorporating electronic components such as high-frequency devices is integral with an antenna element. In such antenna-integrated electronic component modules, it is desirable that, to improve their characteristics, a substrate provided with the antenna element be made of a material having low dielectric constant.

Conventionally, as disclosed in JP-A-9-237867, an antenna-integrated electronic component module was proposed in which an antenna is supplied with power via a slot by utilizing electromagnetic coupling.

However, the slot measures ½ (i.e., $\lambda/2$) of a wavelength $\lambda$ used. Therefore, the physical dimensions of the slot and the module are necessarily dominated by a frequency used. This restricts the degree of freedom of miniaturization of the electronic component module.

Further, because of the use of the $\lambda/2$ slot, the width of a signal pass frequency band is restricted by the slot dimensions, which is an obstruction to increase of the bandwidth of the electronic component module.

SUMMARY OF THE INVENTION

In view of the above, an object of the present invention is to provide an antenna-integrated electronic component module that can be miniaturized and increased in bandwidth.

To attain the above object, an electronic component module according to the invention is characterized by comprising a device-side module comprising a first dielectric substrate that is formed with a first transmission line, and a high-frequency device that is mounted on the first dielectric substrate and connected to the first transmission line; and an antenna-side module comprising a second dielectric substrate that is laid on the first dielectric substrate in such a manner that they are arranged in a lamination direction and that is formed with a second transmission line that is electrically connected to the first transmission line, and an antenna element that is provided on the second dielectric substrate and electrically connected to the high-frequency device via the second transmission line and the first transmission line.

A preferred embodiment of the invention is characterized by further comprising a third dielectric substrate that is formed with a through-hole in which the first dielectric substrate is inserted, mounted with a low-frequency functional component, fixed to the second dielectric substrate, and electrically connected to the first dielectric substrate.

An even preferable embodiment of the invention is characterized in that the first dielectric substrate is made of ceramics.

Another even preferable embodiment of the invention is characterized in that the first dielectric substrate is made of LTCC.

Another even preferable embodiment of the invention is characterized in that the second dielectric substrate is made of a resin.

Still another even preferable embodiment of the invention is characterized in that the first dielectric substrate is formed with a cavity and the high-frequency device is mounted in the cavity.

Another even preferable embodiment of the invention is characterized in that the first dielectric substrate is provided with shielding means that surrounds the high-frequency device and thereby shields it electromagnetically.

Another even preferable embodiment of the invention is characterized in that the shielding means electromagnetically shields a plurality of high-frequency devices individually.

Yet another even preferable embodiment of the invention is characterized in that the shielding means comprises a shield layer that is formed in the first dielectric substrate and a lid member that seals the high-frequency devices.

A further even preferable embodiment of the invention is characterized in that the first dielectric substrate and the second dielectric substrate are laminated on each other.

To attain the above object, a manufacturing method of an electronic component module according to the invention is characterized by comprising the steps of forming a device-side module by mounting a high-frequency device on a first dielectric substrate in such a manner that the high-frequency device is connected to a first transmission line; forming an antenna-side module by providing an antenna element on a second dielectric substrate in such a manner that the antenna element is connected to a second transmission line; and joining the first dielectric substrate and the second dielectric substrate to each other in a lamination direction and thereby electrically connecting the first transmission line and the second transmission line to each other.

A preferred embodiment of the invention is characterized in that the joining of the first dielectric substrate and the second dielectric substrate is performed by applying a conductive bonding material to at least one of a portion of the first transmission line that is exposed in a surface, to be joined to the second dielectric substrate, of the first dielectric substrate and a portion of the second transmission line that is exposed in a surface, to be joined to the first dielectric substrate, of the second dielectric substrate; aligning the first transmission line and the second transmission line with each other and laying the first dielectric substrate and the second dielectric substrate on each other; and solidifying the conductive bonding material and thereby fixing the first transmission line and the second transmission line to each other with electrical continuity established between them.

An even preferable embodiment of the invention is characterized in that the conductive bonding material is solder.

Another even preferable embodiment of the invention is characterized in that the conductive bonding material is a conductive resin paste containing a metal. In general, this conductive resin containing a metal is set by applying heat to it.

The invention provides the following advantages.

In the invention, the first transmission line formed in the first dielectric substrate 11 that is mounted with the high-frequency device and the second transmission line formed in the second dielectric substrate that is provided with the antenna element are directly connected to each other electrically. Therefore, the physical dimensions of the module are not dominated by a frequency used or the signal pass frequency band is not restricted by the dimension of a slot. This makes it possible to miniaturize and increase the bandwidth of an antenna-integrated electronic component module.

Where the third dielectric substrate is provided that is mounted with the low-frequency functional component and formed with the through-hole in which the first dielectric substrate is inserted, the first dielectric substrate can be positioned with respect to the second dielectric substrate by means of the through-hole of the third dielectric substrate.

Where the first dielectric substrate is made of ceramics such as LTCC, the high-frequency device can be mounted on the first dielectric substrate by thermocompression bonding.

Where the second dielectric substrate is made of a resin, the antenna efficiency can be increased.

Where the high-frequency device is mounted in the cavity that is formed in the first dielectric substrate, the height and the loss of the electronic component module can be reduced.

Where the first dielectric substrate is provided with the shielding means that surrounds the high-frequency device and thereby shields it electromagnetically, electromagnetic influences from external electronic apparatus are prevented and hence the operation can be stabilized.

Where the shielding means electromagnetically shields a plurality of high-frequency devices individually, the isolation characteristic between the devices is improved and hence the operating characteristics can be made even more stable.

According to the manufacturing method of an electronic component module in which the device-side module and the antenna-side module are formed separately and then joined to each other, an antenna-integrated electronic component module can be constructed in which the first dielectric substrate and the second dielectric substrate are in such a combination that they cannot be fired simultaneously as in the combination that the first dielectric substrate and the second dielectric substrate are made of ceramics and a resin, respectively.

Where an exposed portion of the first transmission line formed in the first dielectric substrate and an exposed portion of the second transmission line formed in the second dielectric substrate are fixed to each other with a conductive bonding material such as solder, for example, where a solder paste that can be applied to exposed portions of the transmission lines, molten solder extends across only the exposed portions of the first transmission line and the second transmission line having small contact angles. Therefore, the first dielectric substrate and the second dielectric substrate are positioned correctly. The joining of the first transmission line and the second transmission line, which requires fine alignment, can be performed correctly.

The best mode for carrying out the invention will be hereinafter described in detail with reference to the drawings. In the accompanying drawings, the same members are given the same reference symbol. And redundant descriptions will be omitted. The following descriptions will be directed to the best mode for carrying out the invention, and hence the invention is not limited to it.

Figure 1:
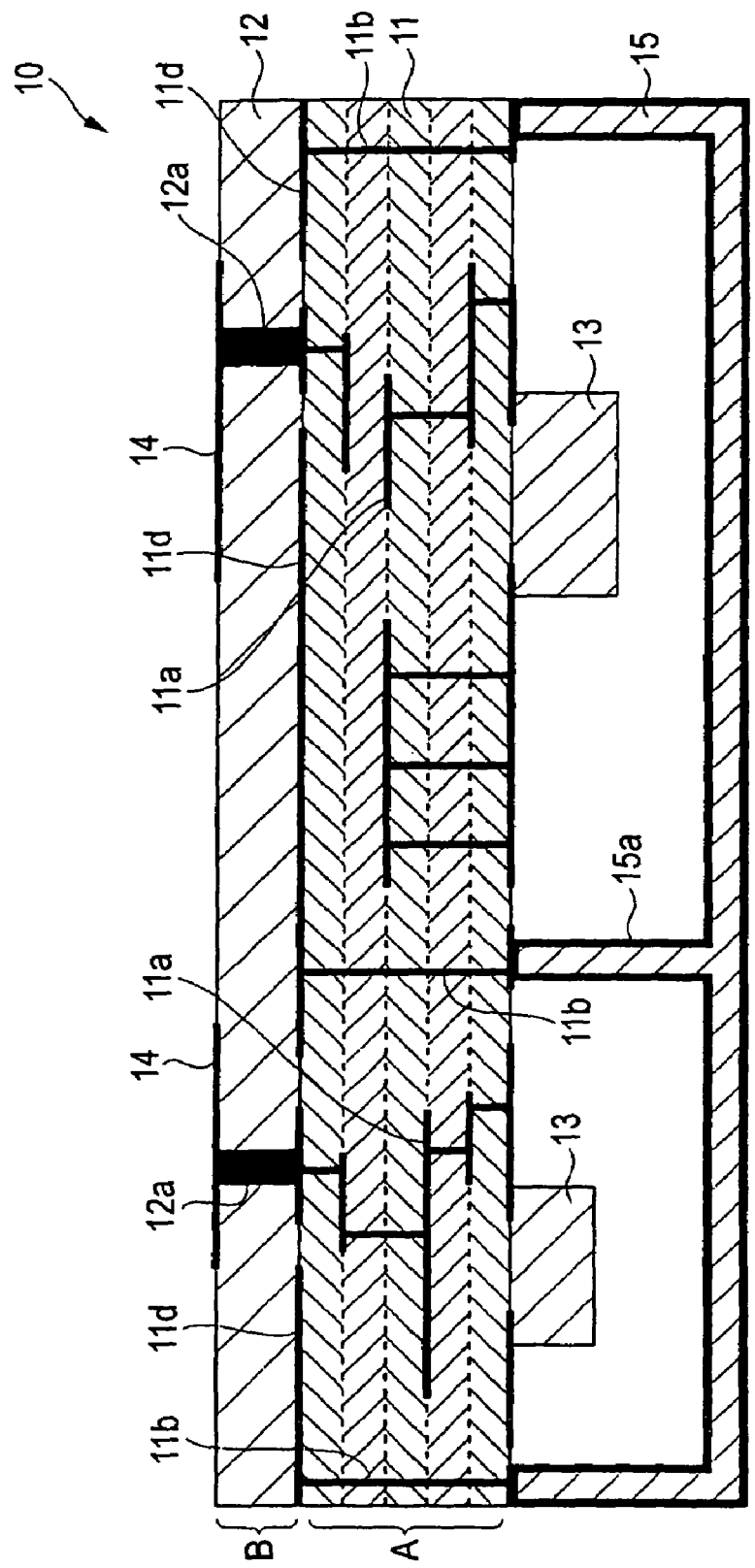
FIG. 1 is a sectional view of an electronic component module according to one embodiment of the present invention.

As shown in FIG. 1, an electronic component module 10 according to this embodiment is equipped with a first dielectric substrate 11 that has a lamination structure and is made of a ceramic dielectric such as LTCC (low temperature co-fired ceramics) and a second dielectric substrate 12 that is made of a resin dielectric such as a fluororesin, a BT resin, a PPE(O) resin, or a graft polymerization resin and is laid on the first dielectric substrate 11 (i.e., the substrates 11 and 12 are arranged in the lamination direction). The first dielectric substrate 11 and the second dielectric substrate 12 constitute a device-side module A and an antenna-side module B, respectively.

First transmission lines 11a are formed in layers in the first dielectric substrate 11, and second transmission lines 12a are formed in the second dielectric substrate 12. The first transmission lines 11a and the second transmission lines 12a are composed of a waveguide and a conductor (in a through-hole) and are made of Au, Ag, Cu, W, or the like. As shown in FIG. 1, the first transmission lines 11a and the second transmission lines 12a are electrically connected to each other. High-frequency devices 13 are mounted on the first dielectric substrate 11 and connected to the first transmission lines 11a, and antenna elements 14 such as patch antennas are provided on the second dielectric substrate 12 and connected to the second transmission lines 12a. Therefore, the antenna elements 14 send or receive a signal to or from the high-frequency devices 13 via the second transmission lines 12a and the first transmission lines 11a that are connected to each other directly.

The high-frequency devices 13 are electronic components that are used in, for example, a 25 GHz band that is a sub-millimeter wave band or a 5 GHz band that is a microwave band. The high-frequency devices 13 are mounted on the first dielectric substrate 11 by surface mounting by soldering or brazing or flip chip mounting with Au, an Au—Sn alloy, or the like. Examples of the high-frequency device 13 are a power amplifier, a mixer, a multiplier, a frequency converter, a high-frequency oscillator, and a low-noise power amplifier. However, the high-frequency devices 13 are not limited to these electronic components. A plurality of antenna elements 14 are formed in array form to obtain good directivity.

A ground layer 11d that is formed on the first dielectric substrate 11 and conductive layers 11b that are connected to the ground layer 11d and extend in the lamination direction also serve as shield layers (described later).

The material of the first dielectric substrate 11 and the second dielectric substrate 12 is not limited to ceramics or a resin and may be another dielectric material. However, the first dielectric substrate 11 made of ceramics makes it possible to mount the high-frequency devices 13 by thermocompression bonding at about 400° C. as in the case of Au connection. The first dielectric substrate 11 need not have a lamination structure. However, the employment of a lamination structure as in this embodiment facilitates formation of a filter functional component etc. within a substrate. The second dielectric substrate 12 made of a resin having low dielectric constant makes it possible to increase the antenna efficiency. It is desirable that the relative dielectric constants of the first dielectric substrate 11 and the second dielectric substrate 12 be about 6 to 45 and about 2 to 5, respectively.

Alternatively, a single, unarrayed antenna element 14 may be employed, an example of which is a multi-band antenna capable of sending and receiving radio waves of a plurality of frequencies by a single antenna. Further, the antenna element 14 is not limited to a patch antenna that is employed in this embodiment and may be any of other forms of antenna such as an inverted-F antenna and a slot antenna.

The first dielectric substrate 11 is equipped with a shielding means for electromagnetically shielding the high-frequency devices 13 by surrounding those. The shielding means is composed of the above-mentioned shield layers (i.e., the conductive layers 11b and the ground layer 11d that are formed in or on the first dielectric substrate 11) and a lid member 15 that seals the high-frequency devices 13. The lid member 15, which is given a shield function in such a manner that, for example, a resin is plated with a metal, electromagnetically seals the high-frequency devices 13 together with the shield layers. Alternatively, the lid member 15 itself may be made of a metal so as to be given a shield function. In the illustrated example, the lid member 15 is formed with a partition 15a and electromagnetically seals the high-frequency devices 13 individually together with the conductive layers 11b formed in the first dielectric substrate 11. As such, the lid member 15 prevents even electromagnetic interference between the high-frequency devices 13: stable operating characteristics are obtained by an improved isolation characteristic. Alternatively, the partition 15a may be omitted in which case only electromagnetic shielding from the outside is attained.

As described above, in the electronic component module 10 according to this embodiment, the first transmission lines 11a formed in the first dielectric substrate 11 that is mounted with the high-frequency devices 13 and the second transmission lines 12a formed in the second dielectric substrate 12 that is provided with the antenna elements 14 are directly connected to each other electrically. Therefore, unlike in the case that the first transmission lines 11a and the second transmission lines 12a are connected to each other electromagnetically via slots, the physical dimensions of the module are not dominated by a frequency used or the signal pass frequency band is not restricted by the dimension of slots. This makes it possible to miniaturize and increase the bandwidth of the antenna-integrated electronic component module.

Further, since the high-frequency devices 13 are electromagnetically shielded by the shielding means, electromagnetic influences from external electronic apparatus are prevented and hence the operation can be stabilized. Still further, since the high-frequency devices 13 are electromagnetically shielded individually, undesirable electromagnetic coupling in the electronic component module is prevented and the isolation characteristic between the devices is improved, whereby the operating characteristics can be made even more stable.

Next, a manufacturing method of the above-configured electronic component module will be described.

First, the high-frequency devices 13 are mounted on the mounting surface of the first dielectric substrate 11 so as to be connected to the first transmission lines 11a, whereby the device-side module A is formed. And the antenna elements 14 are provided on the second dielectric substrate 12 so as to be connected to the second transmission lines 12a, whereby the antenna-side module B is formed (see FIG. 2). Then, the first dielectric substrate 11 and the second dielectric substrate 12 are joined to each other in the lamination direction, whereby the first transmission lines 11a and the second transmission lines 12a are electrically connected to each other.

As a result, the high-frequency devices 13 and the antenna elements 14 are connected to each other via the first transmission lines 11a and the second transmission lines 12a that are directly connected to the high-frequency devices 13 and the antenna elements 14, respectively. Therefore, as described above, the antenna-integrated electronic component module can be miniaturized and increased in bandwidth.

This manufacturing method makes it possible to construct an antenna-integrated electronic component module in which the first dielectric substrate 11 and the second dielectric substrate 12 are in such a combination that they cannot be fired simultaneously as in the combination of this embodiment that the first dielectric substrate 11 and the second dielectric substrate 12 are made of ceramics and a resin, respectively.

The joining of the first dielectric substrate 11 and the second dielectric substrate 12 is performed in the following manner. First, a solder layer as a conductive bonding member is formed on one or both of portions of the first transmission lines 11a that are exposed in the surface, to be bonded to the second dielectric substrate 12, of the first dielectric substrate 11 and portions of the second transmission lines 12a that are exposed in the surface, to be bonded to the first dielectric substrate 11, of the second dielectric substrate 12. The solder layer may be in any of paste form, sheet form, ball form, and BGA (ball grid array) form.

Materials other than solder may be used as the conductive bonding member. For example, paste or sheet-like conductive resins containing a metal that are set when heat, light, an electron beam, or moisture is applied to them may be used.

After application of the solder, the first transmission lines 11a and the second transmission lines 12a are aligned with respect to each other and the first dielectric substrate 11 and the second dielectric substrate 12 are laid on each other and heated. As a result, the solder layer is melted and the first transmission lines 11a and the second transmission lines 12a are joined to each other.

Although molten solder extends across the exposed portions of the first transmission lines 11a and the second transmission lines 12a having small contact angles, it does not extend to the other regions having large contact angles. Therefore, the first dielectric substrate 11 and the second dielectric substrate 12 are positioned by the surface tension of the solder in such a manner that the first transmission lines 11a and the second transmission lines 12a face each other correctly.

Finally, after the positioning, the joined structure is left at ordinary temperature and the solder solidifies: the first dielectric substrate 11 and the second dielectric substrate 12 are fixed to each other while being positioned correctly. In this manner, the two substrates 11 and 12 are fixed to each other with a correct positional relationship. The joining of the first transmission lines 11a and the second transmission lines 12a, which requires fine alignment, can be performed correctly.

Figure 2:
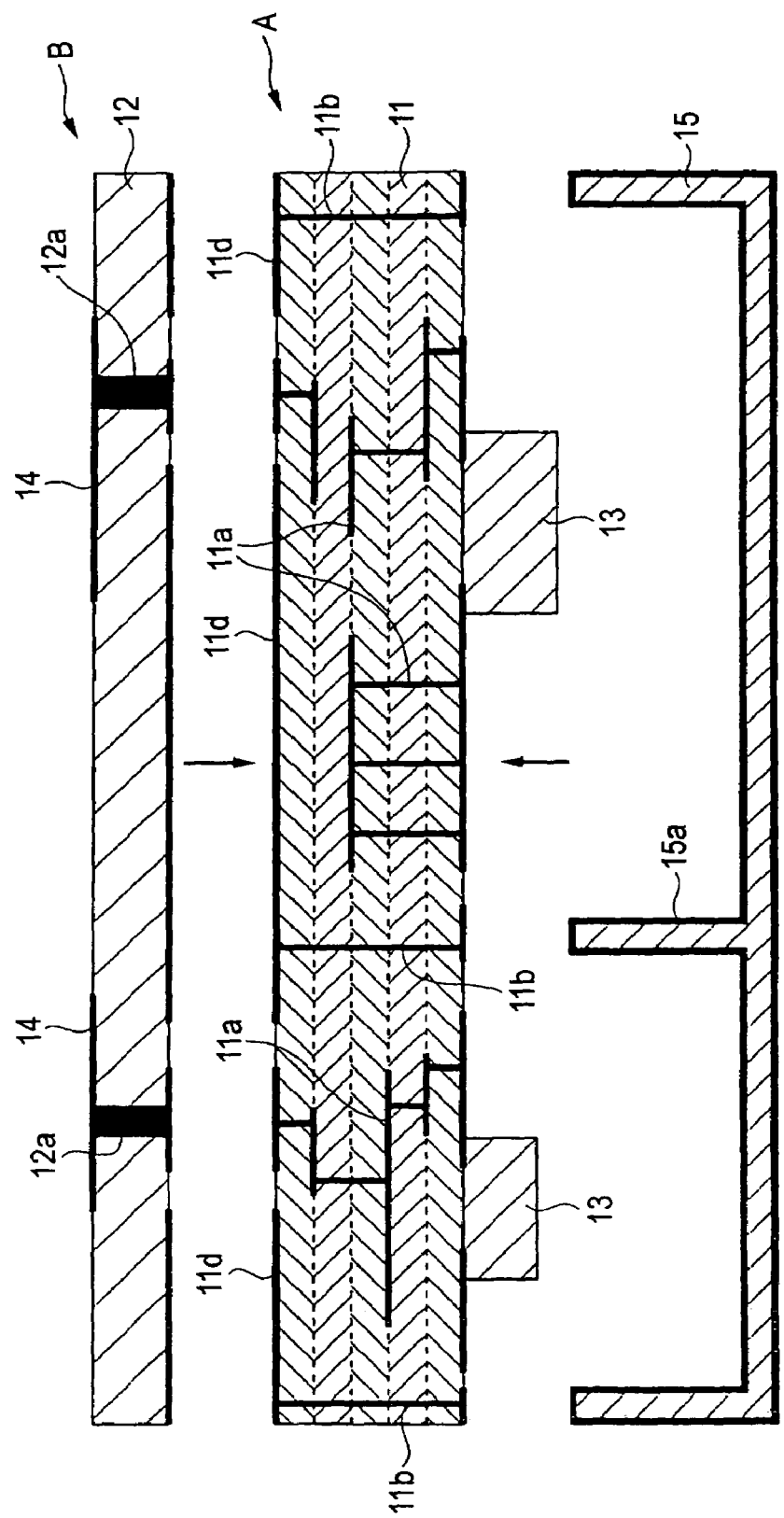
FIG. 2 is a sectional view in which the electronic component module of FIG. 1 is disassembled into constituent elements.

After the joining of the first dielectric substrate 11 and the second dielectric substrate 12, the lid member 15 is attached to the first dielectric substrate 11 to shield the high-frequency devices 13 electromagnetically (see FIG. 2). The electronic component module 10 is thus completed.

Figure 3:
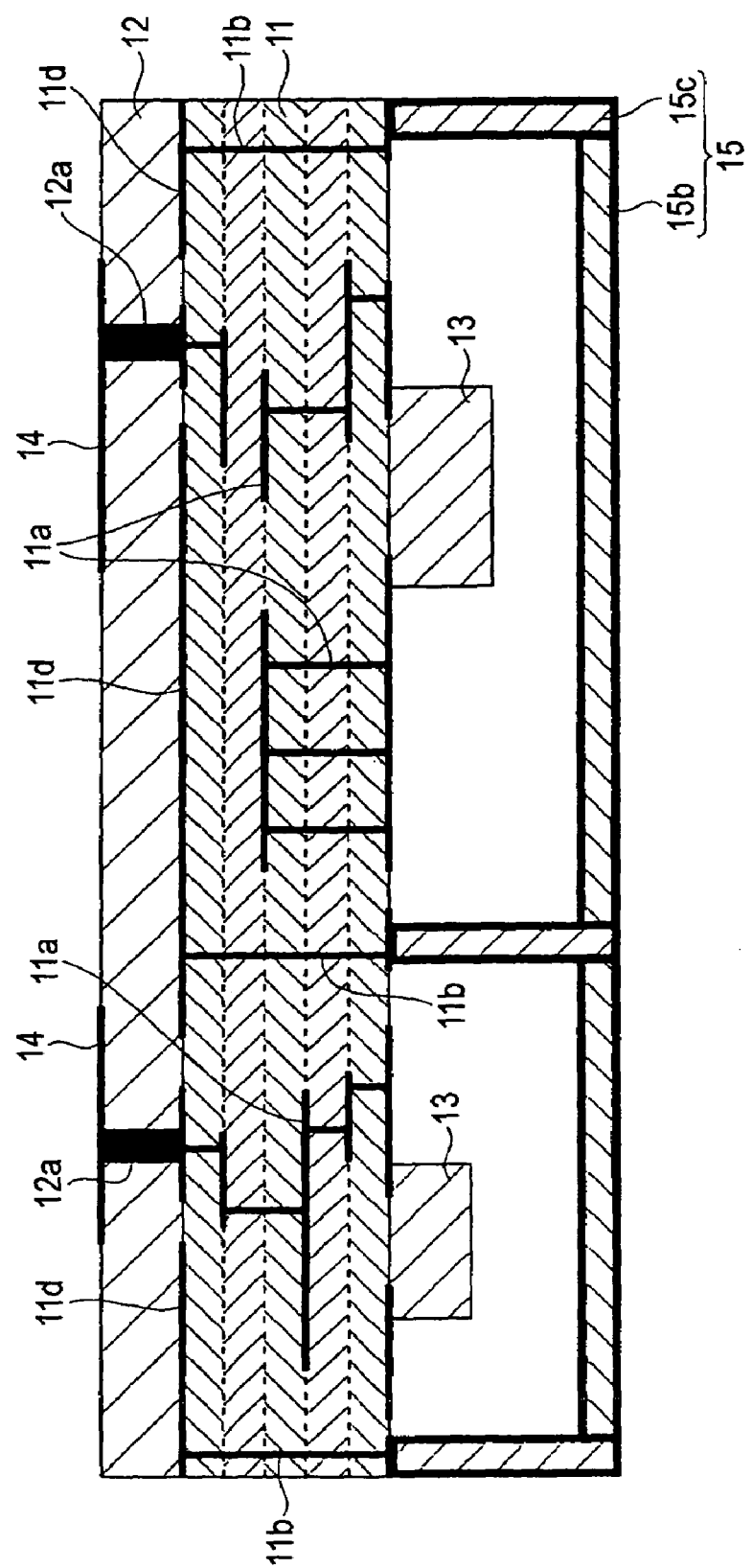
FIG. 3 is a sectional view of an electronic component module according to another embodiment of the invention.

The invention is not limited to the above embodiment. For example, as shown in FIG. 3, the lid member 15 maybe composed of a plate-like lid 15b and spacers 15c as side walls.

Figure 4:
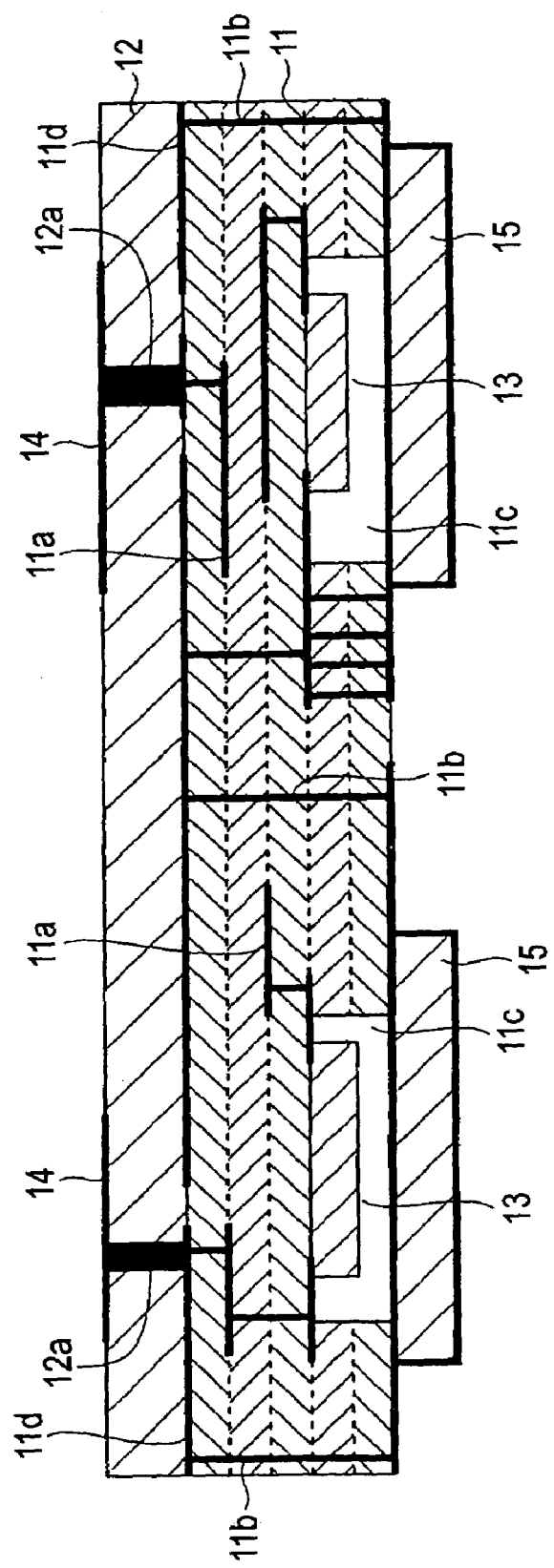
FIG. 4 is a sectional view of an electronic component module according to still another embodiment of the invention.

As shown in FIG. 4, a configuration is possible in which cavities 11b are formed in the first dielectric substrate 11 and the high-frequency devices 13 are mounted in the cavities 11b. This configuration can reduce the height and the loss of the electronic component module 10.

Figure 5:
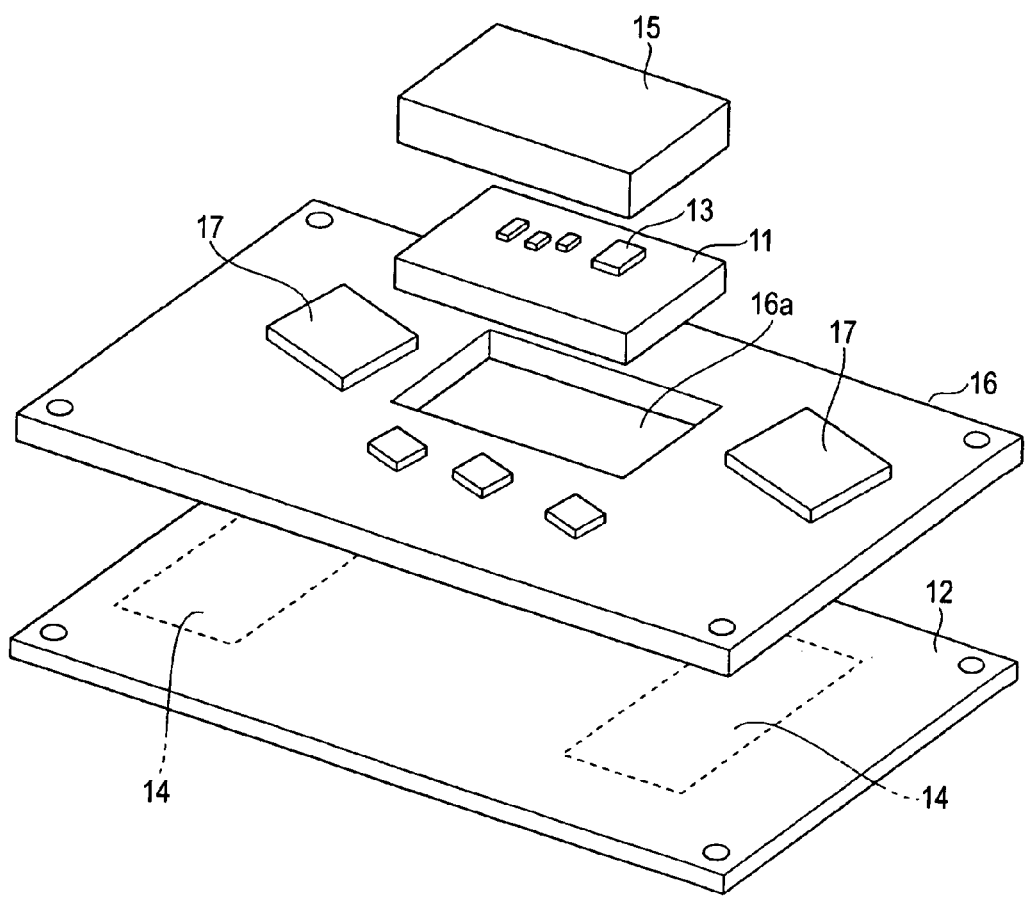
FIG. 5 is an exploded perspective view of an electronic component module according to a further embodiment of the invention.

Further, an electronic component module may be constructed as shown in FIG. 5. A third dielectric substrate 16 that is formed with a through-hole 16a in which the first dielectric substrate 11 mounted with the high-frequency devices 13 is inserted and that is mounted with low-frequency functional components 17. The third dielectric substrate 16 is fixed to the second dielectric substrate 12 by screwing, for example, whereby the first dielectric substrate 11 and the second dielectric substrate 12 are aligned with each other. The first dielectric substrate 11 and the third dielectric substrate 16 are electrically connected to each other via bonded wires, gold ribbons, a cable and connectors, or the like.

Examples of the low-frequency functional components are a control circuit, a computing circuit, and a signal processing circuit. However, the low-frequency functional components are not limited to these electronic components.

An inexpensive electronic component module can be constructed by using, as the third dielectric substrate 16, a common resin substrate such as a glass epoxy resin substrate.

What is claimed is:

1. An electronic component module comprising:
   a device-side module comprising:
      a first dielectric substrate that is formed with a first transmission line; and
      a plurality of high-frequency devices mounted on a first surface of the first dielectric substrate, at lease one of the plurality of high-frequency devices being connected to the first transmission line;
      a shielding means which surrounds and electromagnetically shields the plurality of high-frequency devices individually; and
   an antenna-side module comprising:
      a second dielectric substrate that is laid on a second surface of the first dielectric substrate in such a manner that they are arranged in a lamination direction and that is formed with a second transmission line that is electrically connected to the first transmission line, the second surface being opposite to the first surface; and
      an antenna element that is provided on the second dielectric substrate and electrically connected to the high-frequency device via the second transmission line and the first transmission line.

2. The electronic component module according to claim 1, further comprising a third dielectric substrate that is formed with a through-hole in which the first dielectric substrate is inserted, mounted with a low-frequency functional component, fixed to the second dielectric substrate, and electrically connected to the first dielectric substrate.

3. The electronic component module according to claim 1, wherein the first dielectric substrate is made of ceramics.

4. The electronic component module according to claim 1, wherein the first dielectric substrate is made of low temperature co-fired ceramics.

5. The electronic component module according to claim 1, wherein the second dielectric substrate is made of a resin.

6. The electronic component module according to claim 1, wherein the first dielectric substrate is formed with a cavity and the high-frequency device is mounted in the cavity.

7. The electronic component module according to claim 1, wherein the first dielectric substrate and the second dielectric substrate are laminated on each other.

8. The electronic component module according to claim 1, wherein the shielding means comprises a shield layer that is formed on the first surface of the first dielectric substrate and a lid member that seals the high-frequency devices.

9. The electronic component module according to claim 1, the high-frequency device is electrically connected to the first transmission line via a through-hole formed in the first dielectric substrate.

10. The electronic component module according to claim 1, the antenna element is electrically connected to the second transmission line via a through-hole formed in the second dielectric substrate.

* * * * *